US011562796B2

(12) United States Patent
Yabe

(10) Patent No.: US 11,562,796 B2
(45) Date of Patent: Jan. 24, 2023

(54) FREQUENCY-VOLTAGE CONVERSION CIRCUIT, SEMICONDUCTOR DEVICE, AND MEMORY SYSTEM

(71) Applicant: KIOXIA CORPORATION, Tokyo (JP)

(72) Inventor: Hiroo Yabe, Nerima Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/459,499

(22) Filed: Aug. 27, 2021

(65) Prior Publication Data

US 2022/0293196 A1    Sep. 15, 2022

(30) Foreign Application Priority Data

Mar. 15, 2021   (JP) .............................. JP2021-041398

(51) Int. Cl.
*G11C 5/14*        (2006.01)
*G11C 16/30*       (2006.01)
*H03K 9/06*        (2006.01)
*H03D 3/04*        (2006.01)

(52) U.S. Cl.
CPC .............. *G11C 16/30* (2013.01); *G11C 5/147* (2013.01); *H03D 3/04* (2013.01); *H03K 9/06* (2013.01)

(58) Field of Classification Search
CPC . G11C 16/30; G11C 5/14; H03D 3/04; H03K 9/06
See application file for complete search history.

(56) References Cited

U.S. PATENT DOCUMENTS

| 4,823,091 | A   |   | 4/1989 | Moreau |
| 5,793,257 | A   | * | 8/1998 | Inanami ............... H03K 3/0231 331/25 |
| 5,870,000 | A   | * | 2/1999 | Matsuda ............. H03K 3/0231 331/34 |
| 6,456,170 | B1  | * | 9/2002 | Segawa ................. H03K 5/249 327/54 |
| 8,692,584 | B2  |   | 4/2014 | Nakamura et al. |
| 11,398,825 | B1 | * | 7/2022 | Eimitsu ................... H03L 7/095 |
| 2009/0045880 | A1 | * | 2/2009 | Vanselow ................ H03L 7/02 331/25 |
| 2021/0288618 | A1 | * | 9/2021 | Nakamura .......... H03F 3/45475 |

FOREIGN PATENT DOCUMENTS

| JP | H08-262074 A | 10/1996 |
| JP | 5368626 B2   | 12/2013 |

* cited by examiner

*Primary Examiner* — Khamdan N. Alrobaie
(74) *Attorney, Agent, or Firm* — Kim & Stewart LLP

(57) ABSTRACT

A frequency-voltage conversion circuit includes a constant current source, a first switch connected to an output of the constant current source, a first capacitor connected between the first switch and ground, a second switch connected between a first node that is between the first switch and the first capacitor, and an output node, a third switch connected between the first node and the ground, a fourth switch connected to the output of the constant current source, a second capacitor connected between the fourth switch and the ground, a fifth switch connected between a second node that is between the fourth switch and the second capacitor, and the output node, and a sixth switch connected between the second node and the ground.

20 Claims, 13 Drawing Sheets

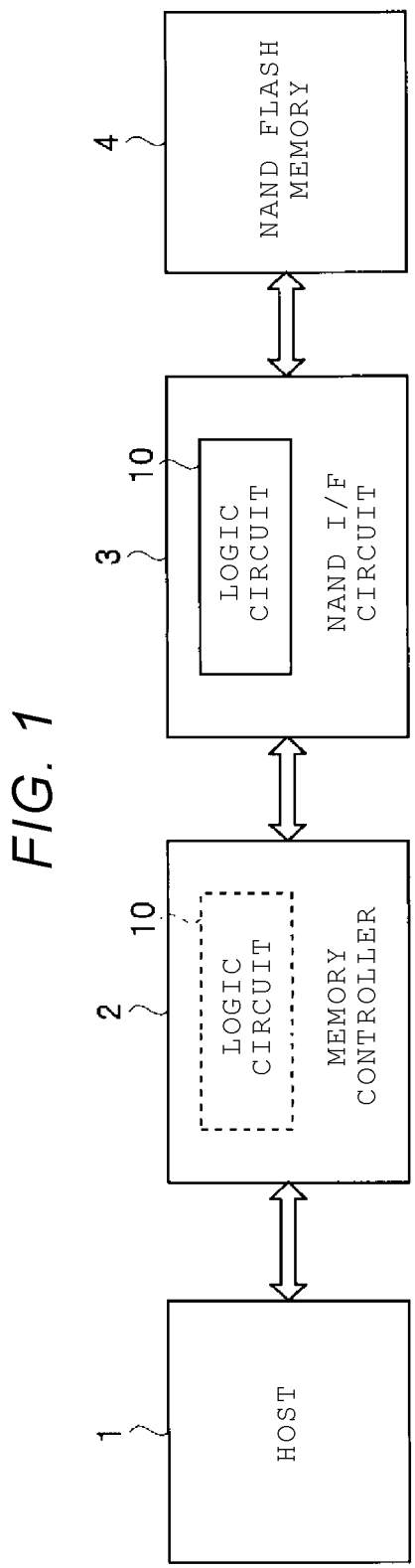

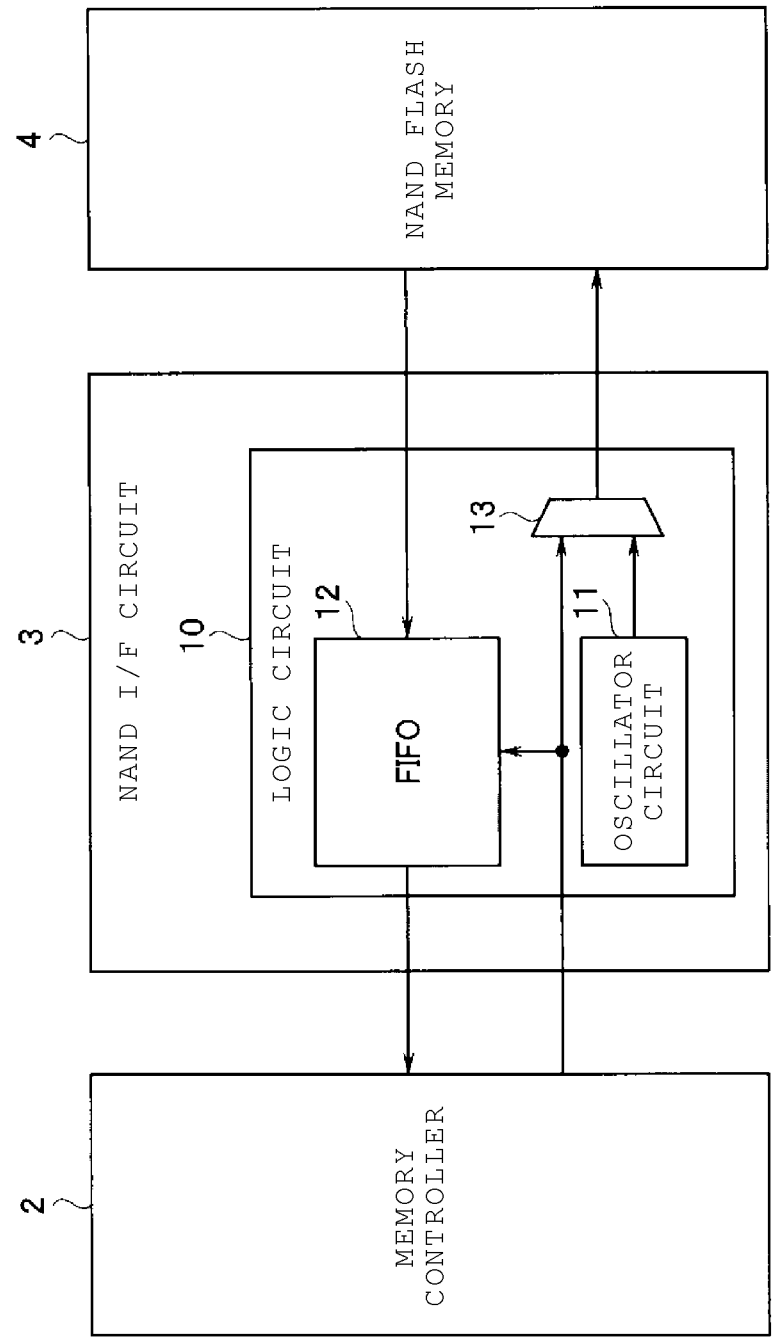

FREQUENCY-VOLTAGE CONVERSION CIRCUIT, SEMICONDUCTOR DEVICE, AND MEMORY SYSTEM

CROSS-REFERENCE TO RELATED APPLICATION

This application is based upon and claims the benefit of priority from Japanese Patent Application No. 2021-041398, filed Mar. 15, 2021, the entire contents of which are incorporated herein by reference.

FIELD

Embodiments described herein relate generally to a frequency-voltage conversion circuit, a semiconductor device, and a memory system.

BACKGROUND

A frequency-voltage conversion circuit that outputs a DC voltage (output voltage) according to a frequency (cycle) is known. The output voltage output from the frequency-voltage conversion circuit is generally required to be constant with respect to changes in the operation of the circuit, power supply voltage, temperature, and the like, but fluctuates due to the influence of sinusoidal noise and the like that are applied to the leakage current or constant current source generated in the circuit.

BRIEF DESCRIPTION OF THE DRAWINGS

FIG. 1 is a block diagram showing a memory system including a semiconductor device according to a first embodiment.

FIG. 2A is a block diagram showing a configuration of a logic circuit provided in a NAND I/F circuit.

DETAILED DESCRIPTION

Figure 2B:
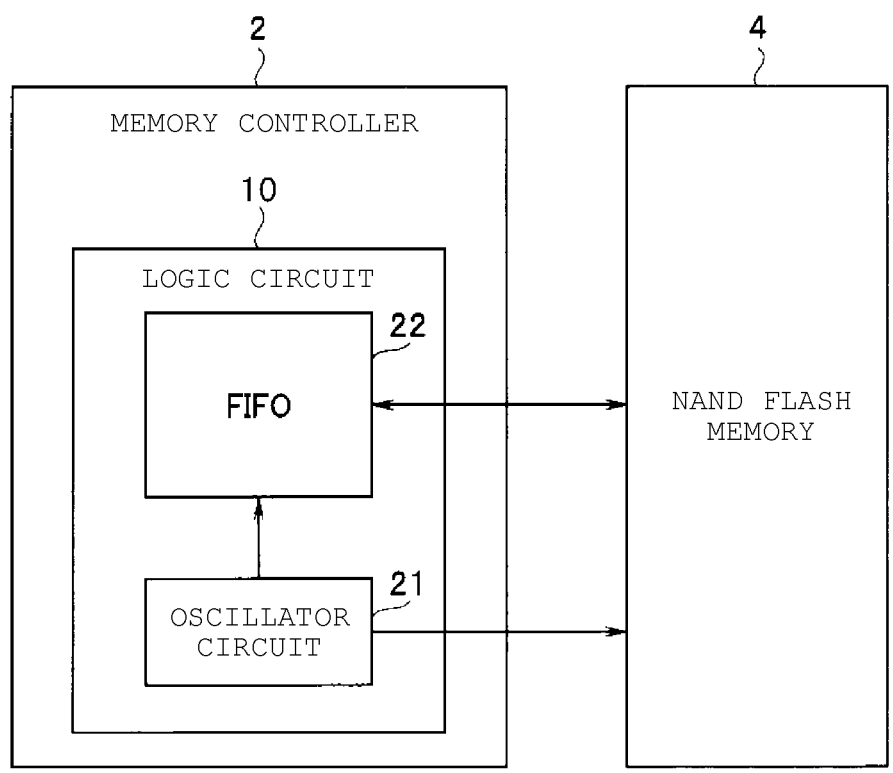
FIG. 2B is a block diagram showing a configuration of a logic circuit provided in a memory controller.

Embodiments provide a frequency-voltage conversion circuit, a semiconductor device, and a memory system, which can prevent leakage current generated in a circuit and output a constant output voltage even when affected by sinusoidal noise applied to a constant current source.

In general, according to one embodiment, the frequency-voltage conversion circuit includes a constant current source; a first switch connected to an output of the constant current source; a first capacitor connected between the first switch and ground; a second switch connected between a first node that is between the first switch and the first capacitor, and an output node; a third switch connected between the first node and the ground; a fourth switch connected to the output of the constant current source; a second capacitor connected between the fourth switch and the ground; a fifth switch connected between a second node that is between the fourth switch and the second capacitor, and the output node; and a sixth switch connected between the second node and the ground.

Hereinafter, embodiments of the present disclosure will be described in detail with reference to the drawings.

First Embodiment

FIG. 1 is a block diagram showing a memory system including a semiconductor device according to the first embodiment. In the memory system of FIG. 1, a host 1 and a memory controller 2 are connected via a predetermined interface. For example, as this interface, various interfaces such as a parallel interface of eMMC (embedded Multi Media Card), a serial extension interface of PCIe (Peripheral Component Interconnect-Express)®, and a high-speed serial interface of M-PHY are employed. The host 1 and the memory controller 2 have built-in interface circuits that employ these various interfaces.

The memory controller 2 and a NAND flash memory 4 are connected via a NAND interface circuit (hereinafter abbreviated as NAND I/F circuit) 3. The NAND I/F circuit 3 employs, for example, a high-speed data transfer mode such as toggle double data rate (ToggleDDR) and various interfaces such as an open NAND flash interface (ONFI), and transfers data between the memory controller 2 and the NAND flash memory 4.

The host 1 generates a write or read request to the memory controller 2. The memory controller 2 controls the writing of data to the NAND flash memory 4 and the reading of data from the NAND flash memory 4 in response to the request from the host.

The memory controller 2 and the NAND flash memory 4 transmit various signals between each other, such as a signal DQ <7:0>, data strobe signals DQS, /DQS, a chip enable signal CE, a command latch enable signal CLE, an address latch enable signal ALE, a write enable signal /WE, read enable signals RE, /RE, and a write protect signal WP, via the NAND I/F circuit 3.

The NAND I/F circuit 3 includes a logic circuit 10. The logic circuit 10 includes an oscillator circuit to be described later and can generate various clocks used for writing data to the NAND flash memory 4, reading data from the NAND flash memory 4, various controls, and the like.

The NAND I/F circuit 3 may be omitted, and in such cases, the memory controller 2 and the NAND flash memory 4 may have a built-in interface circuit having the same function as the NAND I/F circuit 3. For example, in the case of omitting the NAND I/F circuit 3, the memory controller 2 may have the logic circuit 10. This embodiment may be applied not only to the NAND I/F circuit 3 but also to various interface circuits embedded in the host 1, the memory controller 2, and the NAND flash memory 4.

FIG. 2A is a block diagram showing a configuration of a logic circuit when the logic circuit is provided in the NAND I/F circuit.

The logic circuit 10 of the NAND I/F circuit 3 includes an oscillator circuit 11, a FIFO 12, and a selector 13. A command and a first clock are input from the memory controller 2 to the NAND I/F circuit 3. The first clock is supplied to the FIFO 12 and input to one end of the selector 13. A second clock generated by the oscillator circuit 11 is input to the other end of the selector 13.

In the NAND I/F circuit 3, until the command and the first clock are input from the memory controller 2, the selector 13 selects the second clock generated by the oscillator circuit 11 and supplies the second clock to the NAND flash memory 4, thereby reading data from the NAND flash memory 4.

The initial data read from the NAND flash memory 4 is stored in the FIFO 12. After that, when the first clock is input from the memory controller 2, the NAND I/F circuit 3 starts reading data from the FIFO 12 in synchronization with the first clock and outputs the data to the memory controller 2, and the selector 13 selects the first clock and supplies the first clock to the NAND flash memory 4, thereby continuing to read data from the NAND flash memory 4.

FIG. 2B is a block diagram showing a configuration of a logic circuit when the memory controller is provided with the logic circuit.

The logic circuit 10 includes an oscillator circuit 21 and a FIFO 22. When reading data, the memory controller 2 generates a first clock based on the frequency of the oscillator circuit 21 and transmits the first clock to the NAND flash memory 4. In the NAND flash memory 4, the second clock is generated at the same frequency and data rate as the first clock, data is read out at the same frequency and data rate as the first clock, and the second clock and data are transmitted to the memory controller 2.

At the time of writing, the memory controller 2 transmits the second clock and data to the NAND flash memory 4 based on the frequency of the oscillator circuit 21 and performs the writing.

Figure 3:
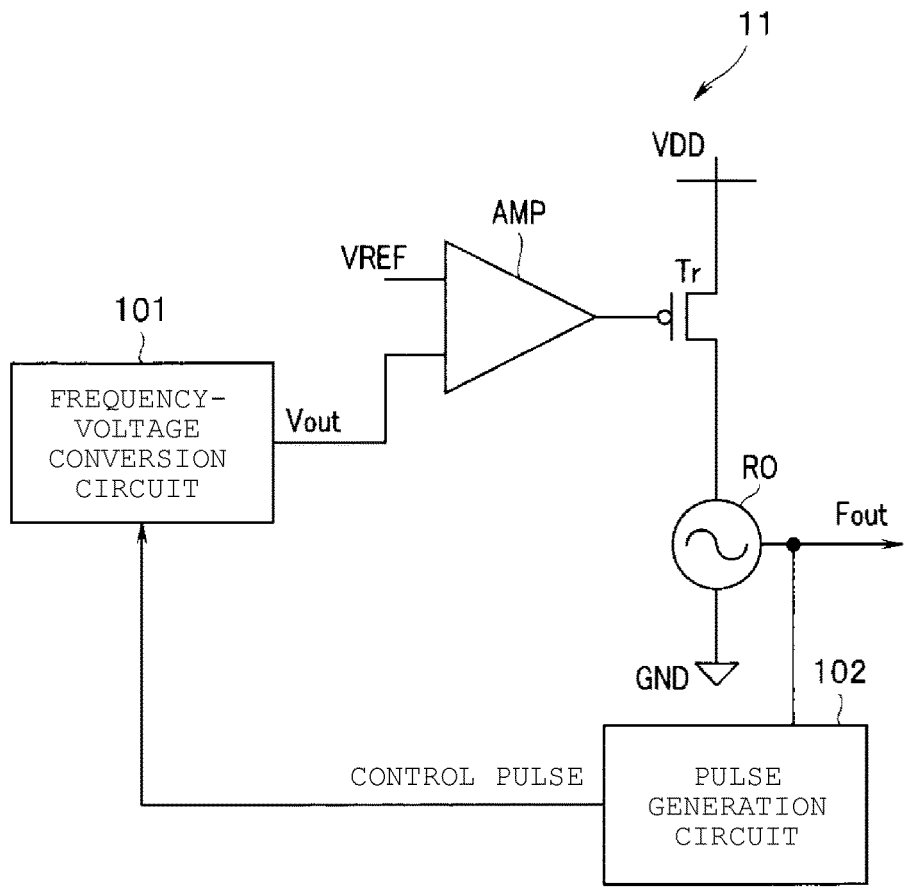
FIG. 3 is a block diagram showing a configuration of an oscillator circuit.

Here, the configuration of the oscillator circuit 11 of FIG. 2A will be described. The oscillator circuit 21 of FIG. 2B has the same configuration as the oscillator circuit 11. FIG. 3 is a block diagram showing a configuration of an oscillator circuit.

The oscillator circuit 11 includes a frequency-voltage conversion circuit 101, a differential amplifier AMP, a PMOS transistor Tr, a ring oscillator RO, and a pulse generation circuit 102.

The frequency-voltage conversion circuit 101 outputs an output voltage Vout corresponding to a predetermined period T of the H level of the control pulse generated by the pulse generation circuit 102. The output voltage Vout output from the frequency-voltage conversion circuit 101 is input to one input terminal (for example, an inverting input terminal) of the differential amplifier AMP. A reference voltage VREF is input to the other input terminal (for example, the non-inverting input terminal) of the differential amplifier AMP. An output terminal of the differential amplifier AMP is connected to a gate terminal of a PMOS transistor Tr. The differential amplifier AMP amplifies and outputs the reference voltage VREF, the output voltage Vout, and the voltage difference.

In the PMOS transistor Tr, the gate is connected to the output terminal of the differential amplifier AMP, a source is connected to a power supply voltage VDD, and a drain is connected to the ring oscillator RO. The PMOS transistor Tr is switched ON or OFF according to the output signal of the differential amplifier AMP, and the supply current to the ring oscillator RO is controlled. As a result, an oscillation frequency Fout of the ring oscillator RO is controlled, and a clock having a predetermined frequency is output from the oscillator circuit 11.

Further, the oscillation frequency Fout output from the ring oscillator RO is input to the pulse generation circuit 102. The pulse generation circuit 102 generates a control pulse having $T \propto 1/Fout$ from the oscillation frequency Fout and outputs the control pulse to the frequency-voltage conversion circuit 101. The frequency-voltage conversion circuit 101 outputs the output voltage Vout corresponding to the predetermined period T of the H level of the control pulse generated based on the oscillation frequency Fout of the ring oscillator RO. The control pulse is a switching control signal for controlling ON or OFF of each switch described later in the frequency-voltage conversion circuit 101.

Then, the differential amplifier AMP compares the output voltage Vout with the reference voltage VREF, and the oscillation frequency Fout of the ring oscillator RO is controlled so that the output voltage Vout=the reference voltage VREF. The oscillator circuit 11 can oscillate at a constant oscillation frequency Fout by repeatedly executing these controls in a loop.

Here, before describing the configuration of the frequency-voltage conversion circuit 101 of the present embodiment, the configurations of the frequency-voltage conversion circuits 201 and 301 of comparative examples, e.g., Comparative Examples 1 and 2, will be described.

(Circuit Configuration of Frequency-Voltage Conversion Circuit of Comparative Example 1)

Figure 4:
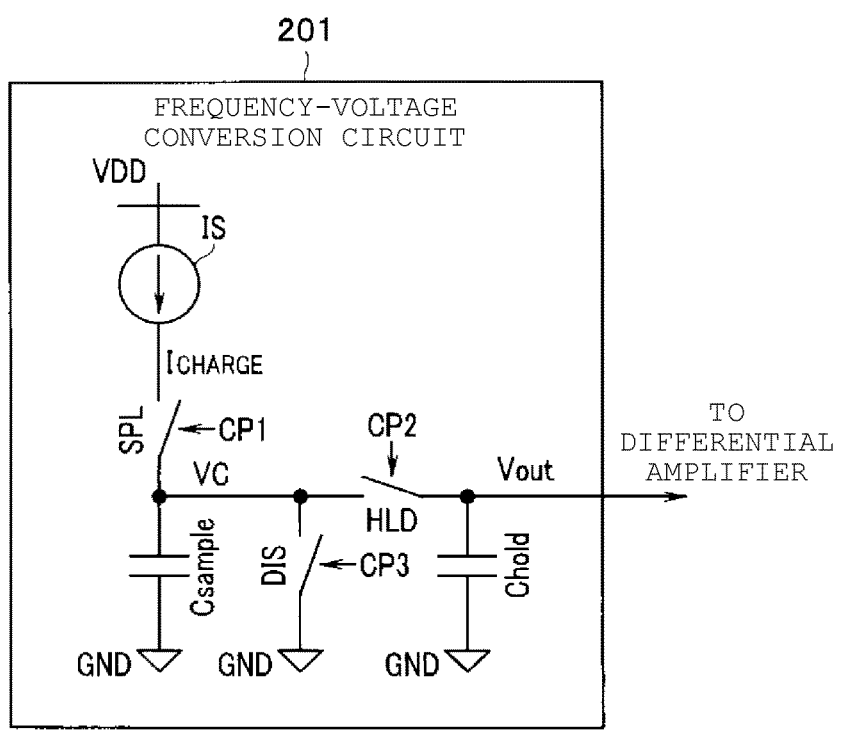
FIG. 4 is a circuit diagram showing a configuration of a frequency-voltage conversion circuit of a first comparative example.

FIG. 4 is a circuit diagram showing a configuration of the frequency-voltage conversion circuit of Comparative Example 1.

The frequency-voltage conversion circuit 201 of Comparative Example 1 has a constant current source IS, a switch SPL, a switch HLD, a switch DIS, a capacitor $C_{sample}$, and a capacitor $C_{hold}$.

The constant current source IS, the switch SPL, and the capacitor $C_{sample}$ are connected in series between the power supply voltage VDD and the ground GND. The capacitor $C_{sample}$, the switch DIS, and the switch HLD are connected in parallel. One end of the switch DIS is connected to a node VC between the switch SPL and the capacitor $C_{sample}$, and the other end thereof is connected to the ground GND. One end of the switch HLD is connected to the node VC, and the other end thereof is connected to one end of the capacitor $C_{hold}$. One end of the capacitor $C_{hold}$ is connected to the other end of the switch HLD, and the other end thereof is connected to the ground GND.

The switches SPL, HLD and DIS are controlled to be ON or OFF by control pulses CP1, CP2, and CP3, respectively. The control pulses CP1, CP2, and CP3 are generated by the pulse generation circuit 102 in the oscillator circuit 11 described above. The switches SPL, HLD, and DIS are in the ON state when the control pulses CP1, CP2, and CP3 are at the H level and are in the OFF state when the control pulses are at the L level, respectively.

Figure 5:
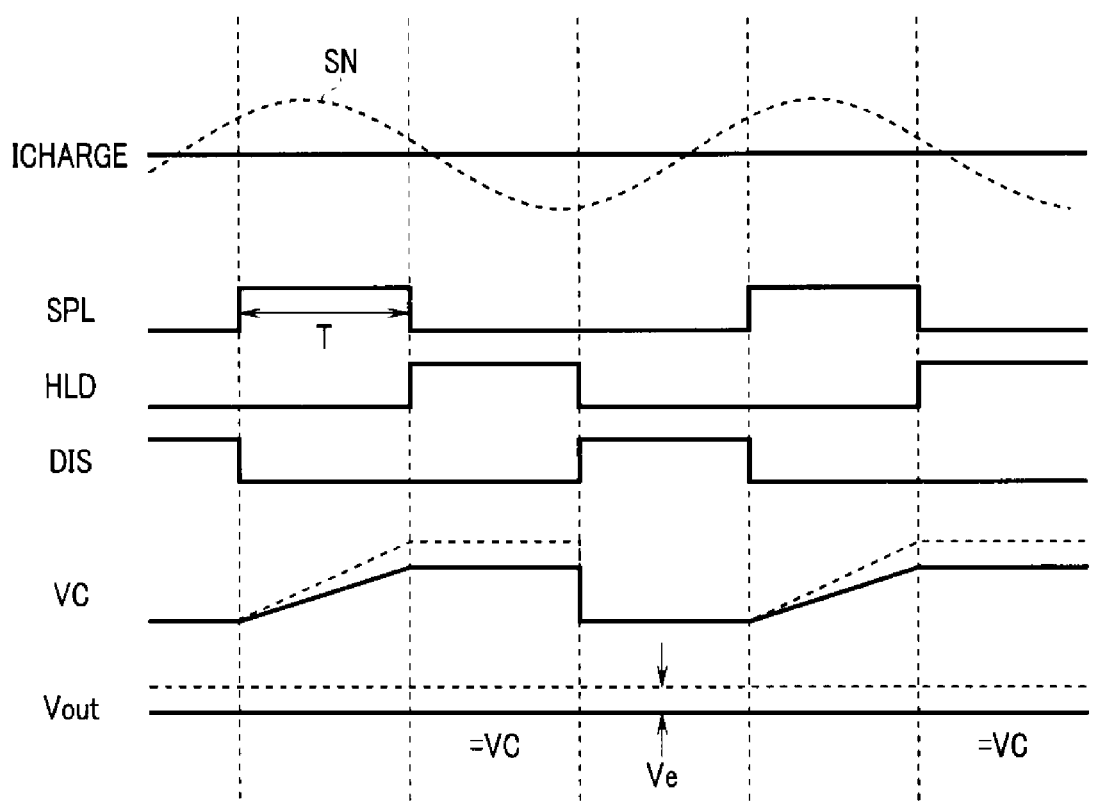
FIG. 5 is a timing chart showing an operation waveform of the frequency-voltage conversion circuit of the first comparative example 1.

FIG. 5 is a timing chart showing an operation waveform of the frequency-voltage conversion circuit of Comparative Example 1. In FIG. 5, the ICHARGE indicates a current $I_{CHARGE}$, which is a first current output from the constant current source IS. Further, SPL, HLD, and DIS indicate voltage waveforms of the control pulses CP1, CP2, and CP3 input to the switches SPL, HLD, and DIS, respectively. Further, VC indicates the voltage waveform of the capacitor $C_{sample}$ (=the voltage waveform of the node VC), and Vout indicates the output voltage Vout of the frequency-voltage conversion circuit 201.

First, when the switch SPL is turned on and the switches HLD and DIS are turned off, the capacitor $C_{sample}$ is charged by the current $I_{CHARGE}$ from the constant current source IS, and the voltage of the node VC rises. That is, since the capacitor $C_{sample}$ is charged by the current $I_{CHARGE}$ for the predetermined period T when the switch SPL is ON, the voltage of the node VC rises according to the predetermined period T when the switch SPL is ON.

Next, when the switch HLD is turned on and the switches SPL and DIS are turned off, the voltage of the node VC is output from the frequency-voltage conversion circuit 201 as the output voltage Vout. Next, when the switch DIS is turned on and the switches SPL and HLD are turned off, the electric charges of the capacitor $C_{sample}$ are discharged to the ground GND via the switch DIS, and the voltage of the node VC is lowered.

The output voltage Vout can be obtained by the following equation (1), where T is the predetermined period of the H level of the control pulse CP1 input to the switch SPL, the current $I_{CHARGE}$ of the constant current source IS, and the capacitance C of the capacitor $C_{sample}$.

$$Vout = I_{CHARGE} \times T/C \quad (1)$$

However, in the case of the circuit configuration of the frequency-voltage conversion circuit 201 of Comparative Example 1, even if the switch SPL is OFF, since the capacitor $C_{sample}$ is charged due to the leakage current flowing from the constant current source IS to the capacitor $C_{sample}$, the output voltage Vout fluctuates.

Further, since the frequency-voltage conversion circuit 201 of Comparative Example 1 is a method of charging the capacitor $C_{sample}$ with a constant current only during the period when the switch SPL is ON, when sinusoidal noise SN is applied to the constant current source IS, the output voltage Vout fluctuates due to the phase difference between the frequency of the sinusoidal noise SN and the operating frequency of the input signal of the switch SPL. The example of FIG. 5 shows a waveform diagram when the frequency of the sinusoidal noise SN and the operating frequency of the input signal of the switch SPL are 1:1.

When the sinusoidal noise SN is applied to the constant current source IS, the capacitor $C_{sample}$ is charged with a current equal to or higher than the constant current (current $I_{CHARGE}$) from the constant current source IS by the sinusoidal noise SN while the switch SPL is ON. As a result, the output voltage Vout of the frequency-voltage conversion circuit 201 fluctuates and has an error Ve as compared with the value of the equation (1).

In the example of FIG. 5, the error Ve fluctuates to the + side. However, the error Ve fluctuates to the − side as well according to the phase difference between the frequency of the sinusoidal noise SN and the operating frequency of the input signal of the switch SPL, and in general, the error Ve cannot, therefore, be controlled.

(Circuit Configuration of Frequency-Voltage Conversion Circuit of Comparative Example 2)

Figure 6:
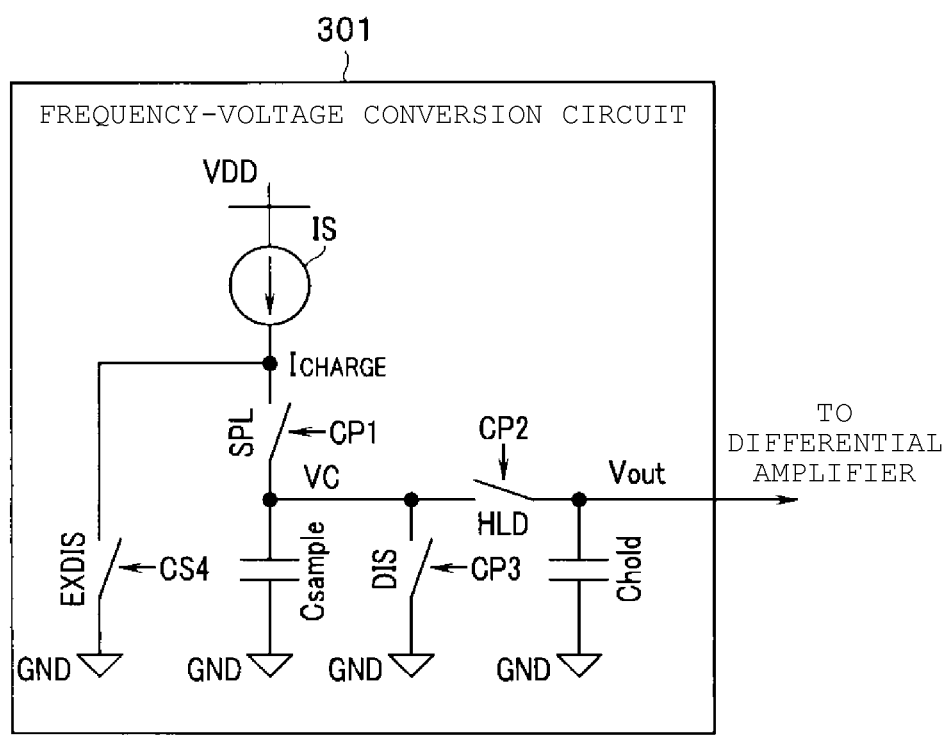
FIG. 6 is a circuit diagram showing a configuration of a frequency-voltage conversion circuit of a second comparative example 2.

FIG. 6 is a circuit diagram showing a configuration of the frequency-voltage conversion circuit of Comparative Example 2. In FIG. 6, the same reference numerals are given to the same configurations as those in FIG. 4.

The frequency-voltage conversion circuit 301 of Comparative Example 2 is configured by adding a switch EXDIS to the frequency-voltage conversion circuit 201 of Comparative Example 1. The switch EXDIS is provided in parallel with the switch SPL, one end of the switch EXDIS is connected to a node between the constant current source IS and the switch SPL, and the other end of the switch EXDIS is connected to the ground GND.

The switch EXDIS is controlled to be ON or OFF according to a control pulse CP4 and is turned ON when the control pulse CP4 is at the H level and OFF when the control pulse CP4 is at the L level.

Figure 7:
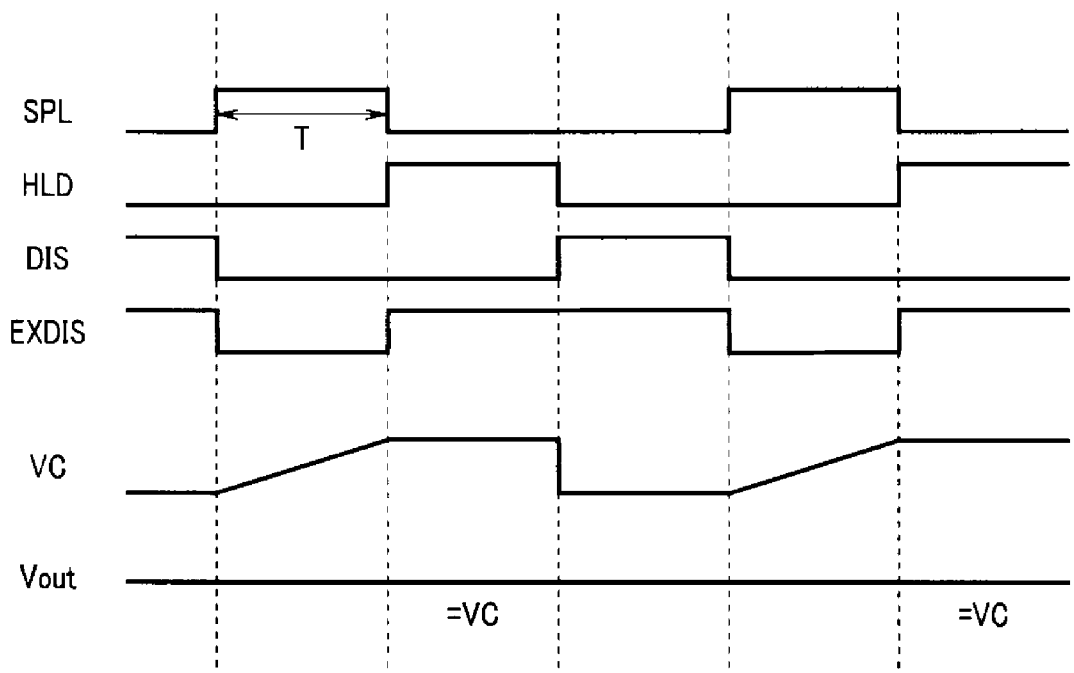
FIG. 7 is a timing chart showing an operation waveform of the frequency-voltage conversion circuit of the second comparative example 2.

FIG. 7 is a timing chart showing an operation waveform of the frequency-voltage conversion circuit of Comparative Example 2. In the operation waveform of FIG. 7, only the part different from the operation waveform of FIG. 5 will be described. In FIG. 7, EXDIS shows the voltage waveform of the control pulse CP4 input to the switch EXDIS.

As shown in FIG. 7, the switch EXDIS is controlled to be ON when the switch SPL is OFF and to be OFF when the switch SPL is ON. As a result, when the switch SPL is ON, the current $I_{CHARGE}$ from the constant current source IS flows to the capacitor $C_{sample}$ On the other hand, when the switch SPL is OFF, the current $I_{CHARGE}$ from the constant current source IS flows to the ground GND via the switch EXDIS.

As a result, in the case of the circuit configuration of the frequency-voltage conversion circuit 301 of Comparative Example 2, when the switch SPL is OFF, the leakage current flowing from the constant current source IS to the capacitor $C_{sample}$ does not occur, and thus, the capacitor $C_{sample}$ is not charged by the leakage current.

However, in the frequency-voltage conversion circuit 301 of Comparative Example 2, when the switch SPL is OFF, a leakage current that flows back from the capacitor $C_{sample}$ to the switch EXDIS is generated. Specifically, when the switch SPL is OFF, the frequency-voltage conversion circuit 301 generates a leakage current that flows from the capacitor $C_{sample}$ to the ground GND via the switches SPL and EXDIS, and the discharge of the capacitor $C_{sample}$ due to this leakage current makes the output voltage Vout fluctuate.

Further, the frequency-voltage conversion circuit 301 of Comparative Example 2 is a method of charging the capacitor $C_{sample}$ with a constant current $I_{CHARGE}$ only during the period when the switch SPL is ON, like the frequency-voltage conversion circuit 201 of Comparative Example 1. Therefore, in the frequency-voltage conversion circuit 301 of Comparative Example 2, the output voltage Vout fluctuates due to the phase difference between the frequency of the sinusoidal noise SN and the operating frequency of the input signal to the switch SPL when the sinusoidal noise SN is applied to the constant current source IS, as in the frequency-voltage conversion circuit 201 of Comparative Example 1.

(Circuit Configuration of Frequency-Voltage Conversion Circuit of First Embodiment)

Figure 8:
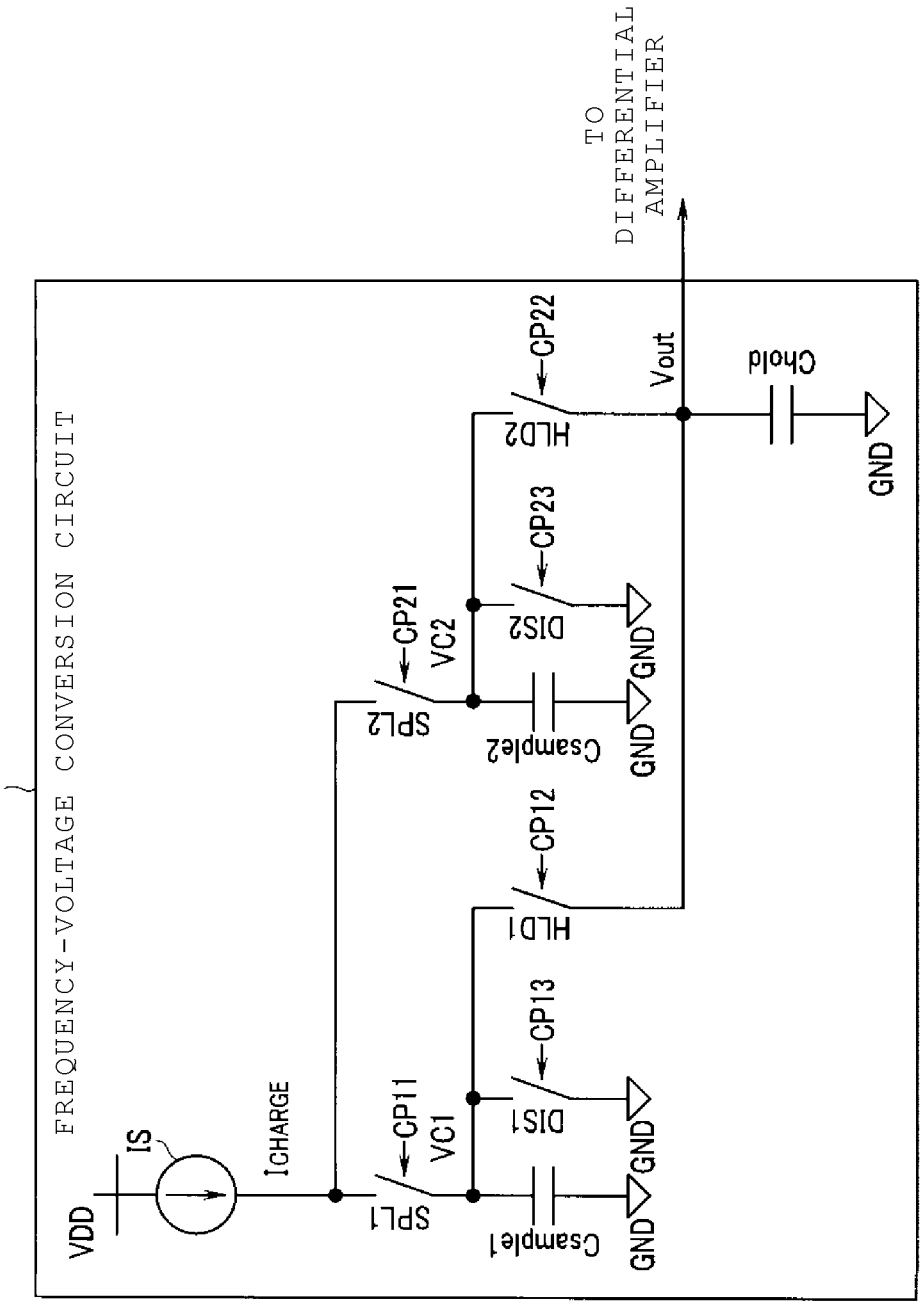
FIG. 8 is a circuit diagram showing a configuration of a frequency-voltage conversion circuit according to the first embodiment.

FIG. 8 is a circuit diagram showing a configuration of the frequency-voltage conversion circuit of the first embodiment.

The frequency-voltage conversion circuit 101 of the first embodiment is configured by arranging two circuit configurations of the frequency-voltage conversion circuit 201 of Comparative Example 1 in parallel and sharing the constant current source IS and the capacitor $C_{hold}$. Specifically, the frequency-voltage conversion circuit 101 includes the constant current source IS, a first switch SPL1, a second switch HLD1, a third switch DIS1, a fourth switch SPL2, a fifth switch HLD2, a sixth switch DIS2, a first capacitor $C_{sample1}$, a second capacitor $C_{sample2}$, and a third capacitor $C_{hold}$. Each of the capacitor $C_{sample1}$ and the capacitor $C_{sample2}$ has the same configuration as the capacitor $C_{sample}$ of Comparative Example 1, and the electric charges accumulated by each of the capacitor $C_{sample1}$ and the capacitor $C_{sample2}$ are equivalent to the electric charges accumulated by the capacitor $C_{sample}$ of Comparative Example 1.

The constant current source IS, the switch SPL1, and the capacitor $C_{sample1}$ are connected in series between the power supply voltage VDD and the ground GND. The capacitor $C_{sample1}$, the switch DIS1, and the switch HLD1 are connected in parallel. One end of the switch DIS1 is connected to a node VC1 between the switch SPL1 and the capacitor $C_{sample1}$, and the other end thereof is connected to the ground GND. One end of the switch HLD1 is connected to the node VC1 and the other end thereof is connected to the output node.

Further, the switch SPL2 is connected to the switch SPL1 in parallel. The capacitor $C_{sample2}$ is connected in series to the switch SPL2. The capacitor $C_{sample2}$, the switch DIS2, and the switch HLD2 are connected in parallel. One end of the switch DIS2 is connected to a node VC2 between the switch SPL2 and the capacitor $C_{sample2}$, and the other end thereof is connected to the ground GND. One end of the switch HLD2 is connected to the node VC2, and the other end thereof is connected to the output node. One end of the capacitor $C_{hold}$ is connected to the output node and the other end thereof is connected to the ground GND.

The switches SPL1, HLD1 and DIS1 are controlled to be ON or OFF by control pulses CP11, CP12, and CP13, respectively. The switches SPL1, HLD1, and DIS1 are in the ON state when the control pulses CP11, CP12, and CP13 are at the H level, and are in the OFF state when the control pulses are at the L level, respectively.

Further, the switches SPL2, HLD2 and DIS2 are controlled to be ON or OFF by control pulses CP21, CP22, and CP23, respectively. The switches SPL2, HLD2, and DIS2 are in the ON state when the control pulses CP21, CP22, and CP23 are at the H level, and are in the OFF state when the control pulses are at the L level, respectively.

Figure 9:
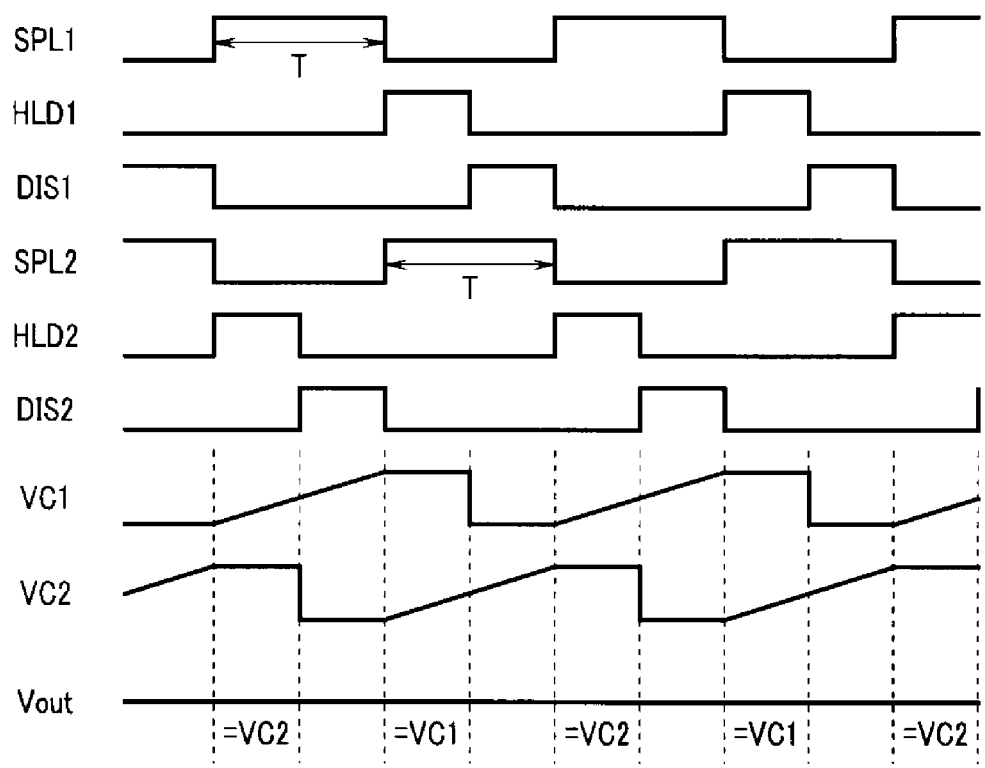
FIG. 9 is a timing chart showing an operation waveform of the frequency-voltage conversion circuit of the first embodiment.

FIG. 9 is a timing chart showing the operation waveform of the frequency-voltage conversion circuit of the first embodiment.

In FIG. 9, SPL1, HLD1, and DIS1 indicate the voltage waveforms of the control pulses CP11, CP12, and CP13 input to the switches SPL1, HLD1, and DIS1, respectively. SPL2, HLD2, and DIS2 indicate the voltage waveforms of the control pulses CP21, CP22, and CP23 input to the switches SPL2, HLD2, and DIS2, respectively. Further, VC1 indicates the voltage waveform of the capacitor $C_{sample1}$ (=voltage waveform of the node VC1), VC2 indicates the voltage waveform of the capacitor $C_{sample2}$ (=voltage waveform of the node VC2), and Vout indicates the output voltage Vout of the frequency-voltage conversion circuit 101.

The switches SPL1 and SPL2 alternately repeat ON and OFF so that either one is ON, and the ON period of each is a predetermined period T. That is, the switch SPL2 is OFF while the switch SPL1 is ON, and the switch SPL2 is ON while the switch SPL1 is OFF.

The switches HLD1 and DIS1 are turned ON and OFF in the order of the switches HLD1 and DIS1 while the switch SPL1 is OFF, and the sum of the periods when the switches HLD1 and DIS1 are ON is the predetermined period T or less.

Similarly, the switches HLD2 and DIS2 are turned ON and OFF in the order of the switches HLD2 and DIS2 while the switch SPL2 is OFF, and the sum of the periods when the switches HLD2 and DIS2 are ON is the predetermined period T or less.

First, while the switch SPL1 is turned on and the current $I_{CHARGE}$ is being charged to the $C_{sample1}$, the switch HLD2 is turned on to connect the capacitor $C_{sample2}$ and the capacitor $C_{hold}$. Next, the switch HLD2 is turned off, the switch DIS2 is turned on, and the electric charges of the capacitor $C_{sample2}$ are discharged to the ground GND via the switch DIS2.

Next, the switch SPL1 is turned off, the switch SPL2 is turned on, and the current $I_{CHARGE}$ starts to be charged to the capacitor $C_{sample2}$. While the switch SPL2 is ON, the switch HLD1 is turned ON to connect the capacitor $C_{sample1}$ and the capacitor $C_{hold}$. Next, the switch HLD1 is turned off, the switch DIS1 is turned on, and the electric charges of the capacitor $C_{sample1}$ are discharged to the ground GND via the switch DIS1.

Under the control of each of the switches SPL1, SPL2, HLD1, HLD2, DIS1, and DIS2, the voltage charged in the capacitor $C_{sample1}$ (=voltage of the node V(21) and the voltage charged in the capacitor $C_{sample2}$ (=voltage of the node VC2) are output from the frequency-voltage conversion circuit 101 as the output voltage Vout. Since the period during which the switches SPL1 and SPL2 are ON is the predetermined period T, the theoretical value of the output voltage Vout is the same as the above-mentioned equation (1).

In the frequency-voltage conversion circuit 101 of the present embodiment, either one of the switches SPL1 and SPL2 is always ON, and the other is always OFF. When the switch SPL1 is ON, the switch SPL2 is OFF, and thus, the current $I_{CHARGE}$ is charged to the capacitor $C_{sample1}$, and when the switch SPL2 is ON, the switch SPL1 is OFF, and thus, the current $I_{CHARGE}$ is charged to the capacitor $C_{sample2}$.

Therefore, in the frequency-voltage conversion circuit 101 of the present embodiment, when the switch SPL1 is OFF and the switch SPL2 is ON, the current $I_{CHARGE}$ flows to the capacitor $C_{sample2}$ side, and thus, it is possible to prevent the switch SPL1 from generating a leakage current and charging the capacitor $C_{sample1}$. Further, in the frequency-voltage conversion circuit 101, when the switch SPL1 is ON and the switch SPL2 is OFF, the current $I_{CHARGE}$ flows to the capacitor $C_{sample1}$ side, and thus, it is possible to prevent the switch SPL2 from generating a leakage current and charging the capacitor $C_{sample2}$. Further, unlike the frequency-voltage conversion circuit 301 of Comparative Example 2, the frequency-voltage conversion circuit 101 does not have the switch EXDIS arranged and a leakage current flowing back through the switch SPL1 or SPL2 does not occur. As a result, the frequency-voltage conversion circuit 101 of the present embodiment can prevent the leakage current generated in the circuit.

Figure 10:
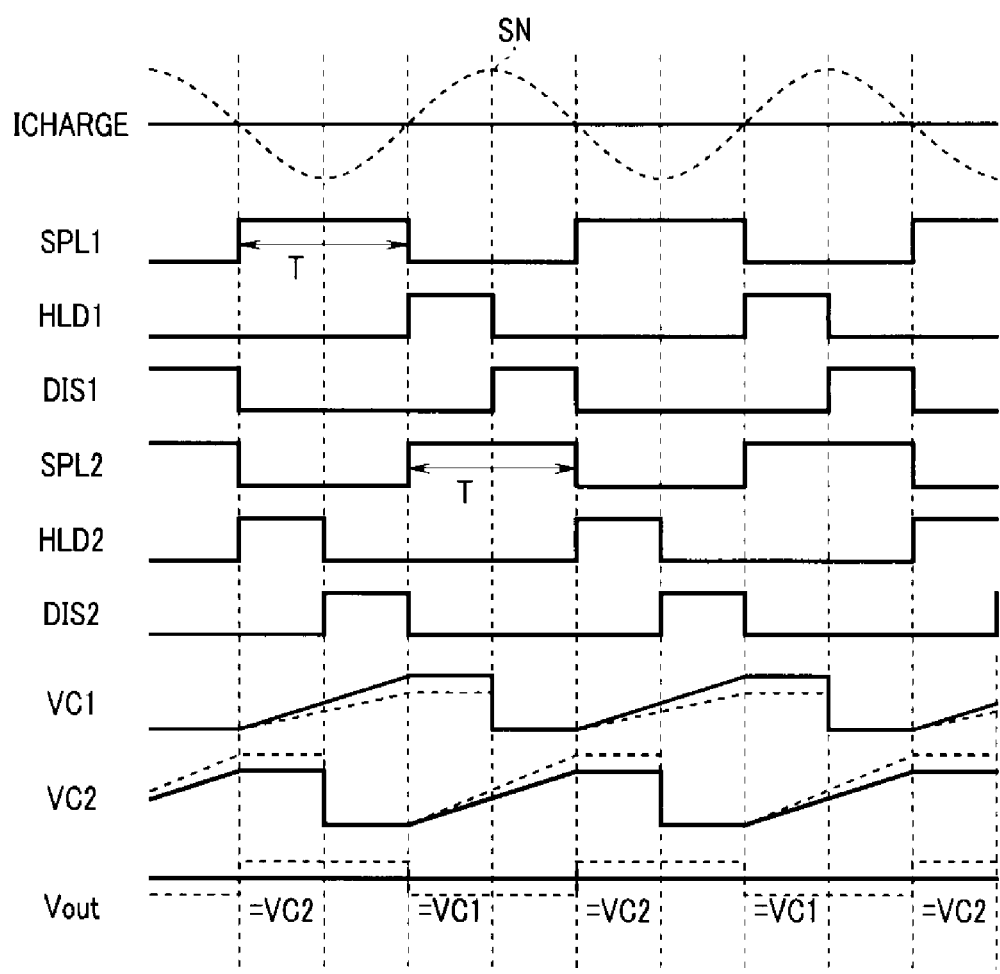
FIG. 10 is a timing chart showing an operation waveform when sinusoidal noise is applied to a constant current source in the frequency-voltage conversion circuit of the first embodiment.

Further, FIG. 10 shows an operation waveform when sinusoidal noise SN is applied to the constant current source IS from a power source or the like. FIG. 10 is a timing chart showing an operation waveform when sinusoidal noise is applied to the constant current source IS in the frequency-voltage conversion circuit of the first embodiment.

In VC1, VC2, and Vout of FIG. 10, the solid line indicates the waveform when the sinusoidal noise SN is not applied to the constant current source IS, and the broken line indicates the waveform when the sinusoidal noise SN is applied to the constant current source IS. In the example of FIG. 10, the case where the frequency of the sinusoidal noise SN and the operating frequency of the input signal of the switch SPL1 are 1:1 will be described as in Comparative Example 1.

As shown in FIG. 10, sinusoidal noise SN lower than the current $I_{CHARGE}$ is applied while the switch SPL1 is ON, and sinusoidal noise SN higher than the current $I_{CHARGE}$ is applied while the switch SPL2 is ON. Therefore, the electric charge charged to the capacitor $C_{sample1}$ is lower than that when the sinusoidal noise SN is not applied to the constant current source IS, and the electric charge charged to the capacitor $C_{sample2}$ is higher than that when the sinusoidal noise SN is not applied to the constant current source IS.

In the frequency-voltage conversion circuit 101 of the present embodiment, since either the switch SPL1 or the SPL2 is ON, the fluctuation of the current $I_{CHARGE}$ due to the sinusoidal noise SN applied to the constant current source IS is charged to one of the capacitor $C_{sample1}$ and the capacitor $C_{sample2}$ over the entire cycle.

As a result, the DC component of the output voltage Vout can generate a value obtained by averaging the fluctuation of the current $I_{CHARGE}$ due to the sinusoidal noise SN applied to the constant current source IS (the same value as the above equation (1)). Therefore, in the frequency-voltage conversion circuit 101 of the present embodiment, the output voltage Vout does not fluctuate due to the influence of the sinusoidal noise SN.

As described above, with the frequency-voltage conversion circuit of the present embodiment, the leakage current generated in the circuit can be prevented and a constant output voltage can be output even when affected by the sinusoidal noise applied to the constant current source.

Second Embodiment

Next, the second embodiment will be described.

Figure 11:
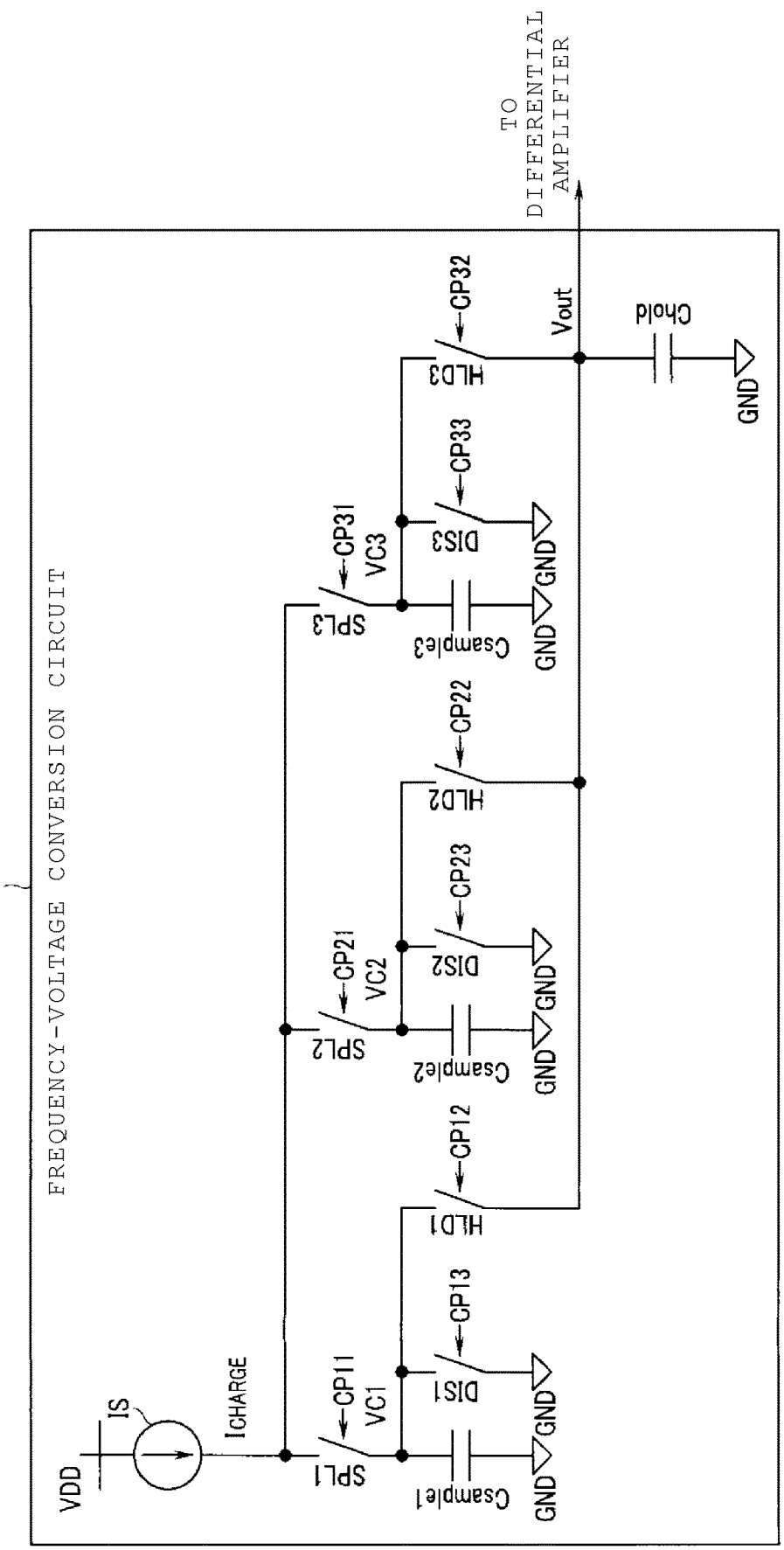
FIG. 11 is a circuit diagram showing a configuration of a frequency-voltage conversion circuit according to a second embodiment.

FIG. 11 is a circuit diagram showing a configuration of a frequency-voltage conversion circuit of the second embodiment.

The frequency-voltage conversion circuit 101 of the first embodiment is configured by arranging two circuit configurations of the frequency-voltage conversion circuit 201 of Comparative Example 1 in parallel and sharing the constant current source IS and the capacitor $C_{hold}$ A frequency-voltage conversion circuit 101A of the second embodiment is configured by arranging three circuit configurations of the frequency-voltage conversion circuit 201 of Comparative Example 1 in parallel and sharing the constant current source IS and the capacitor $C_{hold}$ Specifically, the frequency-voltage conversion circuit 101A of the second embodiment is configured by adding a seventh switch SPL3, an eighth switch HLD3, a ninth switch DIS3, and a fourth capacitor $C_{sample3}$ to the frequency-voltage conversion circuit 101 of the first embodiment. Each of the capacitor $C_{sample1}$, the capacitor $C_{sample2}$, and the capacitor $C_{sample3}$ has the same configuration as the capacitor $C_{sample}$ of Comparative Example 1, and the electric charges accumulated by each of the capacitor $C_{sample1}$, the capacitor $C_{sample2}$, and the capacitor $C_{sample3}$ are equivalent to the electric charges accumulated by the capacitor $C_{sample}$ of Comparative Example 1.

The switch SPL3 is connected in parallel to the switches SPL1 and SPL2. The capacitor $C_{sample3}$, the switch HLD3, and the switch DIS3 are connected in parallel. One end of the capacitor $C_{sample3}$ is connected to SPL3, and the other end thereof is connected to the ground GND. One end of the switch DIS3 is connected to a node VC3 between the switch SPL3 and the capacitor $C_{sample3}$, and the other end thereof is connected to the ground GND. One end of the switch HLD3 is connected to the node VC3, and the other end thereof is connected to the output node.

The switches SPL3, HLD3 and DIS3 are controlled to be ON or OFF by control pulses CP31, CP32, and CP33, respectively. The switches SPL3, HLD3, and DIS3 are in the ON state when the control pulses CP31, CP32, and CP33 are at the H level, and are in the OFF state when the control pulses are at the L level, respectively.

Figure 12:
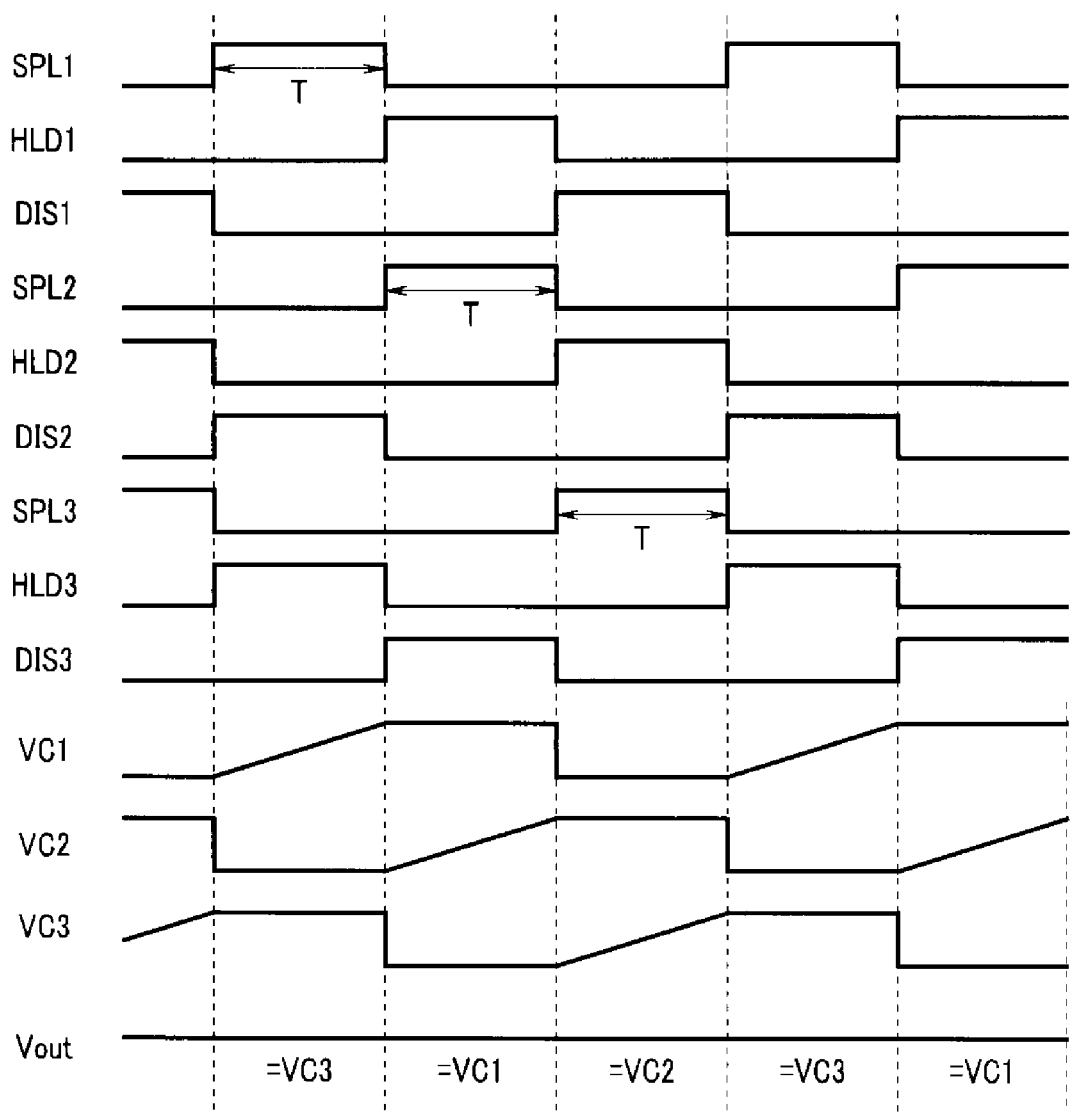
FIG. 12 is a timing chart showing an operation waveform of the frequency-voltage conversion circuit of the second embodiment.

FIG. 12 is a timing chart showing an operation waveform of the frequency-voltage conversion circuit of the second embodiment.

The switches SPL1, SPL2, and SPL3 are repeatedly turned on and off to be turned on in order, and the period in which each is turned on is the predetermined period T. The switches HLD1 and DIS1 are turned on and off in the order of the switches HLD1 and DIS1 while the switch SPL1 is OFF. Further, the period during which the switches HLD1 and DIS1 are ON is not more than twice the predetermined period T, and the ON periods of the switches HLD1 and DIS1 are controlled so as not to overlap.

Similarly, the switches HLD2 and DIS2 are turned on and off in the order of the switches HLD2 and DIS2 while the switch SPL2 is OFF. The period during which the switches HLD2 and DIS2 are ON is not more than twice the predetermined period T, and the ON periods of the switches HLD2 and DIS2 are controlled so as not to overlap.

Similarly, the switches HLD3 and DIS3 are turned on and off in the order of the switches HLD3 and DIS3 while the switch SPL3 is OFF. The period during which the switches HLD3 and DIS3 are ON is not more than twice the predetermined period T, and the ON periods of the switches HLD3 and DIS3 are controlled so as not to overlap.

Other operations and effects are the same as in the first embodiment. Specifically, in the frequency-voltage conversion circuit 101A of the present embodiment, any one of the switches SPL1, SPL2, and SPL3 is always ON, and the other switches are always OFF. When the switch SPL1 is ON, the switches SPL2 and SPL3 are OFF, and thus, the current $I_{CHARGE}$ is charged to the capacitor $C_{sample1}$. Further, when the switch SPL2 is ON, the switches SPL1 and SPL3 are OFF, and thus, the current $I_{CHARGE}$ is charged to the capacitor $C_{sample2}$. Further, when the switch SPL3 is ON, the switches SPL1 and SPL2 are OFF, the current $I_{CHARGE}$ is charged to the capacitor $C_{sample3}$.

Therefore, unlike the frequency-voltage conversion circuit 201 of Comparative Example 1, the frequency-voltage conversion circuit 101A of the present embodiment is not charged by the leakage current when the switch SPL is OFF. Further, unlike the frequency-voltage conversion circuit 301 of Comparative Example 2, the frequency-voltage conversion circuit 101A of the present embodiment does not have the switch EXDIS arranged, and thus, a leakage current flowing back through the switch SPL does not occur.

Further, in the frequency-voltage conversion circuit of the present embodiment, since the switch SPL1, SPL2, or SPL3 is turned on, the fluctuation of the current $I_{CHARGE}$ due to the sinusoidal noise SN applied to the constant current source IS is charged to the capacitor $C_{sample1}$, $C_{sample2}$, or $C_{sample3}$ over the entire cycle. As a result, the DC component of the output voltage Vout can generate a value obtained by averaging the fluctuation of the current $I_{CHARGE}$ due to the sinusoidal noise SN applied to the constant current source IS (the same value as the above equation (1)). Therefore, in the frequency-voltage conversion circuit 101A of the present embodiment, the output voltage Vout does not fluctuate due to the influence of the sinusoidal noise SN, as in the first embodiment.

As described above, with the frequency-voltage conversion circuit of the present embodiment, as in the first embodiment, the leakage current generated in the circuit can be prevented and a constant output voltage can be output even when affected by the sinusoidal noise applied to the constant current source.

(Modification of Second Embodiment)

Figure 13:
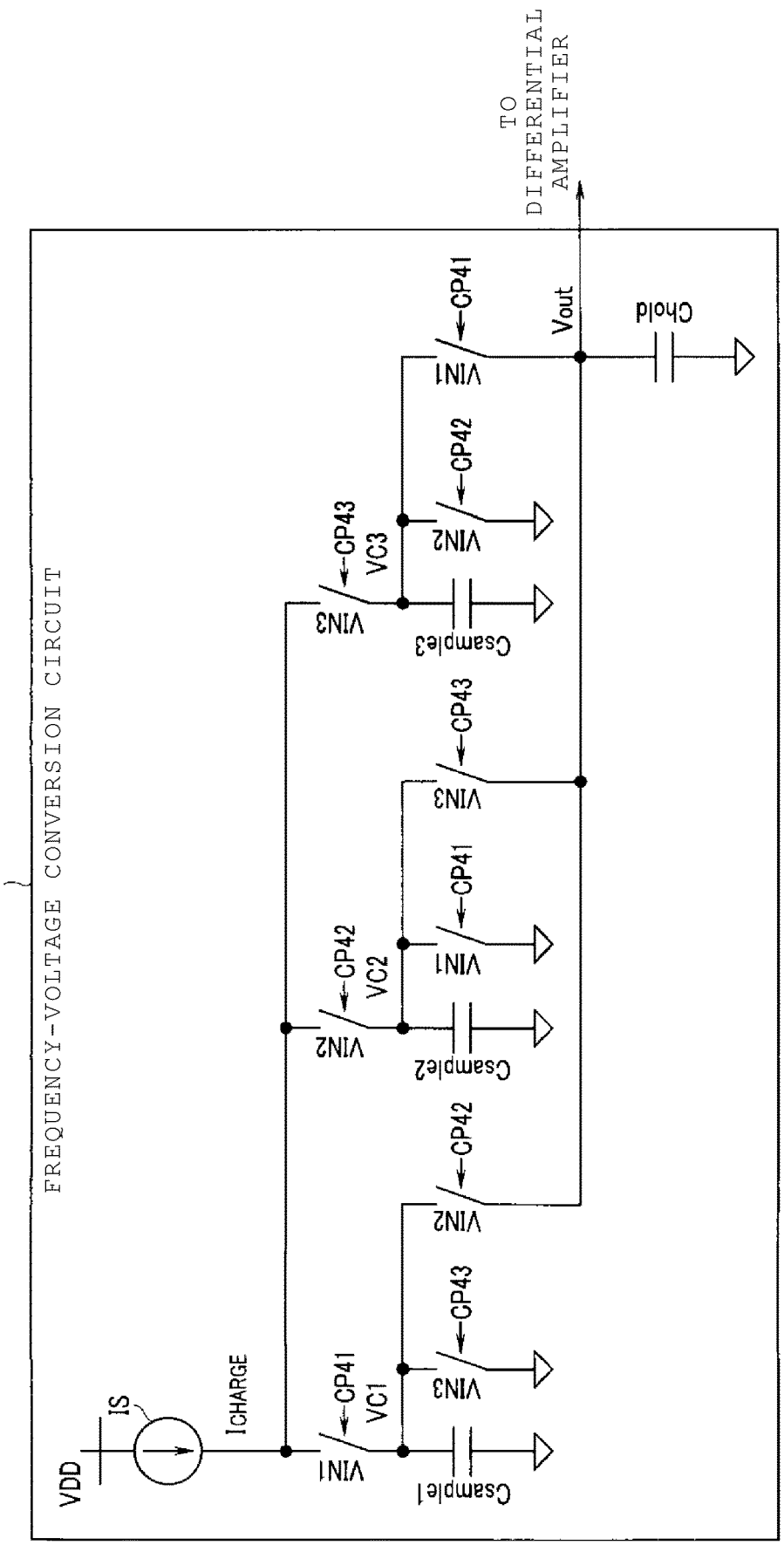
FIG. 13 is a circuit diagram showing a configuration of a frequency-voltage conversion circuit of a modification of the second embodiment.

FIG. 13 is a circuit diagram showing a configuration of a frequency-voltage conversion circuit of a modification of the second embodiment.

A frequency-voltage conversion circuit 101B of the modification of the second embodiment has a configuration in which a switch that performs the same operation is shared, in contrast with the frequency-voltage conversion circuit 101A of the second embodiment. Specifically, in the frequency-voltage conversion circuit 101B, the switch SPL1, the switch DIS2, and the switch HLD3 in FIG. 11 are shared by a switch VIN1; the switch HLD1, the switch SPL2, and the switch DIS3 are shared by a switch VIN2; and the switch DIS1, the switch HLD2, and the switch SPL3 are shared by a switch VIN3. Further, the frequency-voltage conversion circuit 101B has the same size for all the switches VIN1, VIN2, and VIN3.

A first control pulse CP41 is commonly supplied to each switch VIN1, which is referred to as a first switch group, and a second control pulse CP42 is commonly supplied to each switch VIN2, which is referred to as a second switch group. A third control pulse CP43 is commonly supplied to each switch VIN3, which is referred to as a third switch group.

The switches VIN1, VIN2 and VIN3 are controlled to be ON or OFF by the control pulses CP41, CP42, and CP43, respectively. The switches VIN1, VIN2, and VIN3 are in the ON state when the control pulses CP41, CP42, and CP43 are at the H level, and are in the OFF state when the control pulses are at the L level, respectively.

Figure 14:
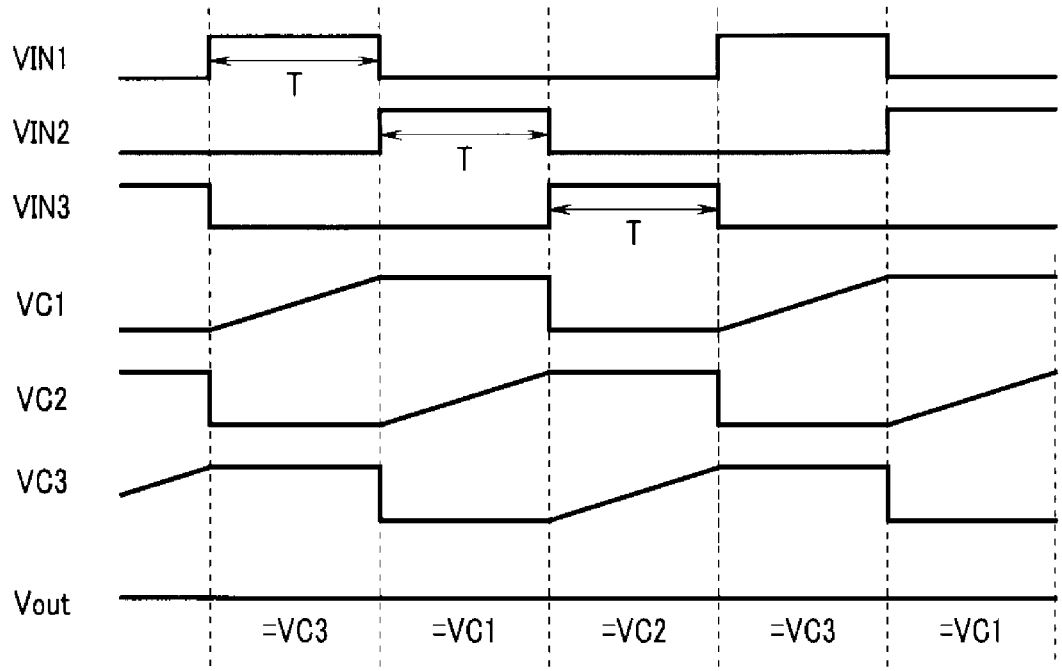
FIG. 14 is a timing chart showing an operation waveform of the frequency-voltage conversion circuit of the modification of the second embodiment.

FIG. 14 is a timing chart showing the operation waveform of the frequency-voltage conversion circuit of the modification of the second embodiment.

The switches VIN1, VIN2, and VIN3 are repeatedly turned on and off so that any one thereof is turned on in order, and each ON period is the predetermined period T. Each switch VIN1 of the first switch group is controlled to be ON or OFF by the common control pulse CP41. Further, each switch VIN2 of the second switch group is controlled to be ON or OFF by the common control pulse CP42. Further, each switch VIN3 of the third switch group is controlled to be ON or OFF by the common control pulse CP43. Therefore, the frequency-voltage conversion circuit 101B of the modification can perform the same control as in the second embodiment only with the three control pulses CP41, CP42, and CP43.

Here, the effect when the sizes of the switches VIN1, VIN2, and VIN3 are all the same will be described.

(Configuration of Frequency-Voltage Conversion Circuit of Comparative Example 3)

Figure 15:
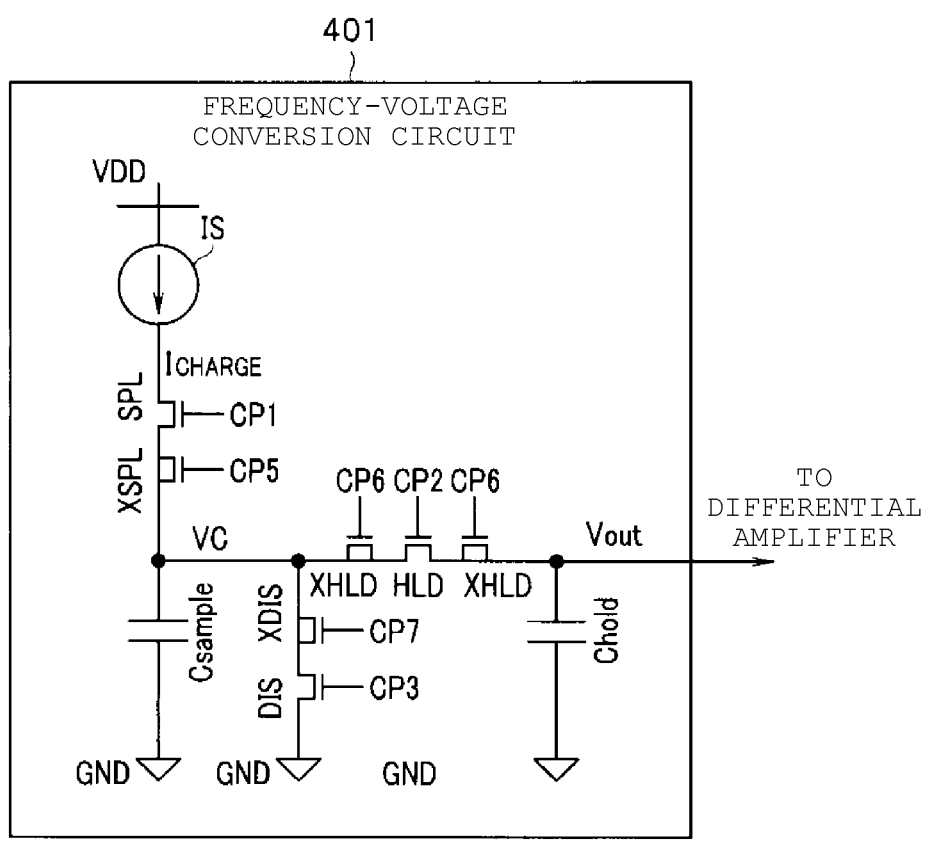
FIG. 15 is a circuit diagram showing a configuration of a frequency-voltage conversion circuit of a third comparative example 3.

FIG. 15 is a circuit diagram showing a configuration of a frequency-voltage conversion circuit of Comparative Example 3.

In a frequency-voltage conversion circuit 401 of Comparative Example 3, the switches SPL, HLD, and DIS of the frequency-voltage conversion circuit 201 of Comparative Example 1 are implemented by MOSFETs (metal-oxide-semiconductor field-effect transistors). When the switches SPL, HLD, DIS, and the like are implemented by MOSFETs to implement the circuit configuration of the frequency-voltage conversion circuit 201 of Comparative Example 1, the potential fluctuation occurs in the node VC and an error occurs in the output voltage Vout due to the gate-source capacitance at the timing when the respective switches SPL, HLD, and DIS are turned ON and OFF. In order to eliminate the error of the output voltage Vout, it is necessary to arrange counter switches adjacent to the switches SPL, HLD, and DIS.

Therefore, the frequency-voltage conversion circuit 401 of Comparative Example 3 is configured by arranging counter switches XSPL, XHLD, and XDIS adjacent to the switches SPL, HLD, and DIS. The counter switches XSPL, XHLD, and XDIS have the same gate-source capacitance as the switches SPL, HLD, and DIS, respectively (each gate width/gate length are equal). For example, the counter switch XSPL has half the number of gate fingers of the switch SPL, and by shorting the source and drain, the gate-source capacitance is the same as that of the switch SPL.

Further, control pulses CP5, CP6, and CP7 input to the counter switches XSPL, XHLD, and XDIS have opposite H and L characteristics to those of the control pulses CP1, CP2, and CP3 input to the switches SPL, HLD, and DIS, respectively. As a result, for example, the counter switch XSPL switches from OFF to ON at the same timing when the switch SPL switches from ON to OFF, and switches from ON to OFF at the same timing when the switch SPL switches from OFF to ON.

On the other hand, in the case of the circuit configuration of the frequency-voltage conversion circuit 101B of the present modification, all of the switches VIN1, VIN2, and VIN3 have the same size, and the timings for turning on and off are the same for each switch. Therefore, the voltage fluctuation at the time of switching is canceled between respective switches.

For example, when the switch VIN1 is turned ON from OFF in the node VC1 having the capacitor $C_{sample1}$, the switch VIN3 having the same size as the switch VIN1 is turned OFF from ON at the same timing, and thus, the voltage fluctuation due to switching is canceled.

As a result, in the frequency-voltage conversion circuit 101B of the present modification, even when the switches VIN1, VIN2, and VIN3 are implemented by MOSFETs, it is not necessary to generate the counter switches XSPL, XHLD, and XDIS, and the control pulses CP5, CP6 and CP7 for the counter switches XSPL, XHLD, and XDIS, unlike the frequency-voltage conversion circuit 401 of Comparative Example 3.

That is, in the frequency-voltage conversion circuit 101B of the present modification, by configuring the switches VIN1, VIN2, and VIN3 having the same size, the voltage fluctuation due to switching can be canceled and the output voltage Vout can be stabilized without adding counter switches and generating a control pulse for the counter switch even when the switches VIN1, VIN2, and VIN3 are implemented by MOSFETs.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A frequency-voltage conversion circuit comprising:
a constant current source;
a first switch connected to an output of the constant current source;
a first capacitor connected between the first switch and ground;
a second switch connected between a first node that is between the first switch and the first capacitor, and an output node;
a third switch connected between the first node and the ground;
a fourth switch connected to the output of the constant current source;
a second capacitor connected between the fourth switch and the ground;
a fifth switch connected between a second node that is between the fourth switch and the second capacitor, and the output node; and
a sixth switch connected between the second node and the ground.

2. The frequency-voltage conversion circuit according to claim 1, further comprising:
a third capacitor connected between the output node and the ground.

3. The frequency-voltage conversion circuit according to claim 1, wherein a capacitance of the first capacitor is equal to a capacitance of the second capacitor.

4. The frequency-voltage conversion circuit according to claim 1, wherein, during operation of the frequency-voltage conversion circuit:
a constant current is output from the constant current source and a voltage is output from the output node, and
when the first switch is turned on for a first period, the fourth switch is turned off, and when the fourth switch is turned on for the first period, the first switch is turned off.

5. The frequency-voltage conversion circuit according to claim 4, wherein, during the operation of the frequency-voltage conversion circuit:
the second and third switches are sequentially turned on and then off while the first switch is turned off, and a period during which the second and third switches are turned on is equal to or less than the first period, and
the fifth and sixth switches are sequentially turned on and then off while the fourth switch is turned off, and a period during which the fifth and sixth switches are turned on is equal to or less than the first period.

6. The frequency-voltage conversion circuit according to claim 1, further comprising:
a seventh switch connected to the output of the constant current source;
a third capacitor connected between the seventh switch and the ground;
an eighth switch connected between a third node that is between the seventh switch and the third capacitor, and the output node; and
a ninth switch connected between the third node and the ground.

7. The frequency-voltage conversion circuit according to claim 6, wherein, during operation of the frequency-voltage conversion circuit:
a constant current is output from the constant current source and a voltage is output from the output node, and
when the first switch is turned on for a first period, the fourth and seventh switches are turned off, and when the fourth switch is turned on for the first period, the first and seventh switches are turned off, and when the seventh switch is turned on for the first period, the first and fourth switches are turned off.

8. The frequency-voltage conversion circuit according to claim 7, wherein, during the operation of the frequency-voltage conversion circuit:
the second and third switches are sequentially turned on and then off in the order of the second and third switches while the first switch is turned off, and a total period during which the second and third switches are turned on is not more than twice the first period,
the fifth and sixth switches are sequentially turned on and then off while the fourth switch is turned off, and a total period during which the fifth and sixth switches are turned on is not more than the twice the first period, and
the eighth and ninth switches are sequentially turned on and then off while the seventh switch is turned off, and a total period during which the eighth and ninth switches are turned on is not more than the twice the first period.

9. The frequency-voltage conversion circuit according to claim 6, wherein
the first, sixth, and eighth switches are controlled together to be turned on or off by a first control pulse,
the second, fourth, and ninth switches are controlled together to be turned on or off by a second control pulse, and
the third, fifth, and seventh switches are controlled together to be turned on or off by a third control pulse.

10. The frequency-voltage conversion circuit according to claim 9, wherein all of the switches are metal-oxide-semiconductor field-effect transistors having the same size.

11. A semiconductor device comprising:
a frequency-voltage conversion circuit; and
an oscillator circuit configured to generate a clock having a predetermined frequency according to an output voltage output from the frequency-voltage conversion circuit,
wherein the frequency-voltage conversion circuit includes:
a constant current source;
a first switch connected to an output of the constant current source;
a first capacitor connected between the first switch and ground;
a second switch connected between a first node that is between the first switch and the first capacitor, and an output node;
a third switch connected between the first node and the ground;

a fourth switch connected to the output of the constant current source;
a second capacitor connected between the fourth switch and the ground;
a fifth switch connected between a second node that is between the fourth switch and the second capacitor, and the output node; and
a sixth switch connected between the second node and the ground.

12. The semiconductor device according to claim 11, wherein the frequency-voltage conversion circuit further includes:
a third capacitor connected between the output node and the ground.

13. The semiconductor device according to claim 12, wherein a capacitance of the first capacitor is equal to a capacitance of the second capacitor.

14. The semiconductor device according to claim 11, wherein, during operation of the frequency-voltage conversion circuit:
a constant current is output from the constant current source and a voltage is output from the output node, and
when the first switch is turned on for a first period, the fourth switch is turned off, and when the fourth switch is turned on for the first period, the first switch is turned off.

15. The semiconductor device according to claim 14, wherein, during the operation of the frequency-voltage conversion circuit:
the second and third switches are sequentially turned on and then off while the first switch is turned off, and a period during which the second and third switches are turned on is equal to or less than the first period, and
the fifth and sixth switches are sequentially turned on and then off while the fourth switch is turned off, and a period during which the fifth and sixth switches are turned on is equal to or less than the first period.

16. The semiconductor device according to claim 11, wherein the frequency-voltage conversion circuit further includes:
a seventh switch connected to the output of the constant current source;
a third capacitor connected between the seventh switch and the ground;
an eighth switch connected between a third node that is between the seventh switch and the third capacitor, and the output node; and
a ninth switch connected between the third node and the ground.

17. The semiconductor device according to claim 16, wherein, during operation of the frequency-voltage conversion circuit:
a constant current is output from the constant current source and a voltage is output from the output node, and
when the first switch is turned on for a first period, the fourth and seventh switches are turned off, and when the fourth switch is turned on for the first period, the first and seventh switches are turned off, and when the seventh switch is turned on for the first period, the first and fourth switches are turned off.

18. The semiconductor device according to claim 17, wherein, during the operation of the frequency-voltage conversion circuit:
the second and third switches are sequentially turned on and then off in the order of the second and third switches while the first switch is turned off, and a total period during which the second and third switches are turned on is not more than twice the first period,
the fifth and sixth switches are sequentially turned on and then off while the fourth switch is turned off, and a total period during which the fifth and sixth switches are turned on is not more than the twice the first period, and
the eighth and ninth switches are sequentially turned on and then off while the seventh switch is turned off, and a total period during which the eighth and ninth switches are turned on is not more than the twice the first period.

19. The semiconductor device according to claim 16, wherein
the first, sixth, and eighth switches are controlled together to be turned on or off by a first control pulse,
the second, fourth, and ninth switches are controlled together to be turned on or off by a second control pulse, and
the third, fifth, and seventh switches are controlled together to be turned on or off by a third control pulse.

20. The semiconductor device according to claim 19, wherein all of the switches are metal-oxide-semiconductor field-effect transistors having the same size.

* * * * *